United States Patent
Chu et al.

(10) Patent No.: US 9,356,139 B2
(45) Date of Patent: May 31, 2016

(54) POWER MOSFETS AND METHODS FOR FORMING THE SAME

(71) Applicant: Taiwan Semiconductor Manufacturing Company, Ltd., Hsin-Chu (TW)

(72) Inventors: Fu-Yu Chu, Hsin-Chu (TW); Chih-Chang Cheng, Hsin-Chu (TW); Tung-Yang Lin, New Taipei (TW); Ruey-Hsin Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/625,904

(22) Filed: Feb. 19, 2015

(65) Prior Publication Data

US 2015/0162442 A1 Jun. 11, 2015

Related U.S. Application Data

(63) Continuation of application No. 13/739,024, filed on Jan. 11, 2013, now Pat. No. 9,000,517.

(51) Int. Cl.
| | |
|---|---|
| *H01L 29/66* | (2006.01) |
| *H01L 29/78* | (2006.01) |
| *H01L 21/266* | (2006.01) |
| *H01L 29/08* | (2006.01) |
| *H01L 29/10* | (2006.01) |
| *H01L 21/265* | (2006.01) |
| *H01L 29/40* | (2006.01) |

(52) U.S. Cl.
CPC .......... *H01L 29/7823* (2013.01); *H01L 21/266* (2013.01); *H01L 29/0847* (2013.01); *H01L 29/0865* (2013.01); *H01L 29/0882* (2013.01); *H01L 29/1095* (2013.01); *H01L 29/66659* (2013.01); *H01L 29/7816* (2013.01); *H01L 29/7835* (2013.01); *H01L 21/26586* (2013.01); *H01L 29/1045* (2013.01); *H01L 29/402* (2013.01)

(58) Field of Classification Search
None
See application file for complete search history.

(56) References Cited

U.S. PATENT DOCUMENTS

| | | | |
|---|---|---|---|
| 5,757,045 A | 5/1998 | Tsai et al. | |
| 6,599,782 B1 | 7/2003 | Kikuchi et al. | |
| 7,304,348 B2 * | 12/2007 | Ehwald | H01L 29/0615 257/328 |
| 2011/0215403 A1 * | 9/2011 | Huang | H01L 29/78 257/336 |

* cited by examiner

*Primary Examiner* — Sonya D McCall Shepard
(74) *Attorney, Agent, or Firm* — Slater Matsil, LLP

(57) ABSTRACT

Power Metal-Oxide-Semiconductor Field-Effect Transistors (MOSFETs) and methods of forming the same are provided. A power MOSFET may comprise a first drift region formed at a side of a gate electrode, and a second drift region beneath the gate electrode, adjacent to the first drift region, with a depth less than a depth of the first drift region so that the first drift region and the second drift region together form a stepwise shape. A sum of a depth of the second drift region, a depth of the gate dielectric, and a depth of the gate electrode may be of substantially a same value as a depth of the first drift region. The first drift region and the second drift region may be formed at the same time, using the gate electrode as a part of the implanting mask.

20 Claims, 9 Drawing Sheets

POWER MOSFETS AND METHODS FOR FORMING THE SAME

This application is a continuation of U.S. application Ser. No. 13/739,024, filed on Jan. 11, 2013, entitled "Power MOSFETs and Methods for Forming the Same," which application is incorporated by reference herein

BACKGROUND

Since the invention of semiconductor devices based on the bipolar technology, such as the bipolar junction transistor (BJT), strong efforts have been made to increase the power handling capability of these devices in order to extend their applications. The metal-oxide-semiconductor field-effect transistor (MOSFET) is a transistor used for amplifying or switching electronic signals. The MOSFET is a four-terminal device with source (S), gate (G), drain (D), and body (B) terminals. The MOSFET is by far the most common transistor in both digital and analog circuits, though the BJT was at one time much more common.

As the CMOS technology gained importance and process technology in the field of integrated circuits was surpassing the development of bipolar technology used for power devices, the power MOSFET was introduced. It is now possible to use the steady progress in CMOS technology for the development of improved power devices such as the power MOSFET. Power MOSFET may have superior performance compared to its bipolar counterpart. For example, the n-channel power MOSFET is operating with electron transport which is inherently faster than the combined electron and hole transport the BJTs rely on.

Power MOSFETs are known for a better switching speed compared to BJT power devices, and they require very little gate drive power because of the insulated gate. The main drawbacks of the power MOSFET are high on-resistance $R_{dson}$ and the hot carrier injection (HCl) problem. Methods and apparatus are needed to improve the power MOSFET performance on the high on-resistance and the HCl problem.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Figure 1A:
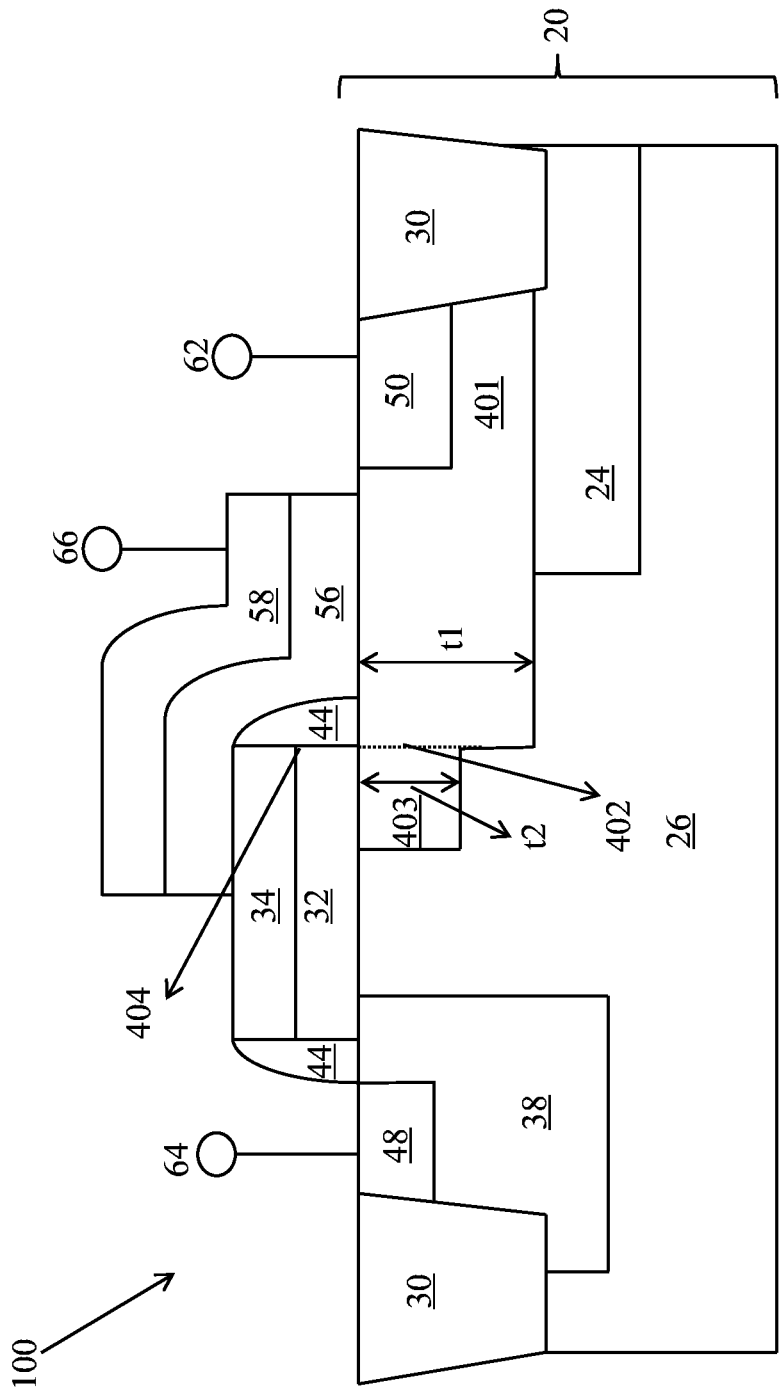
FIGS. 1(a)-1(b) illustrate in cross sectional views a power MOSFET in accordance with some embodiments.

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Power Metal-Oxide-Semiconductor Field-Effect Transistors (MOSFETs) and the methods of forming the same are provided in accordance with various exemplary embodiments. The intermediate stages of forming the power MOSFETs are illustrated. A power MOSFET may comprise a first drift region within a first region formed at a side of a gate electrode, wherein the first region is of a first conductivity type and the first drift region is of a second conductivity type opposite to the first conductivity type. The power MOSFET may also comprise a second drift region of the second conductivity type, wherein the second drift region is within the first region and beneath the gate electrode, adjacent to the first drift region, with a depth less than a depth of the first drift region so that the first drift region and the second drift region together form a stepwise shape. The first drift region and the second drift region may be formed at the same time, using the gate electrode as a part of the implanting mask. A sum of a depth of the second drift region, a depth of the gate dielectric, and a depth of the gate electrode may be of substantially a same value as a depth of the first drift region. The two drift regions of the power MOSFET can reduce the high on-resistance $R_{dson}$, reduce device capacitance, and further improve HCl capability, while the first drift region alone suffers stronger hot-carrier reliability problem because of shallower current flow near silicon surface.

It will be understood that when an element or layer is referred to as being "on," "connected to" or "coupled to" another element or layer, it can be directly on, or connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"—when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1B:
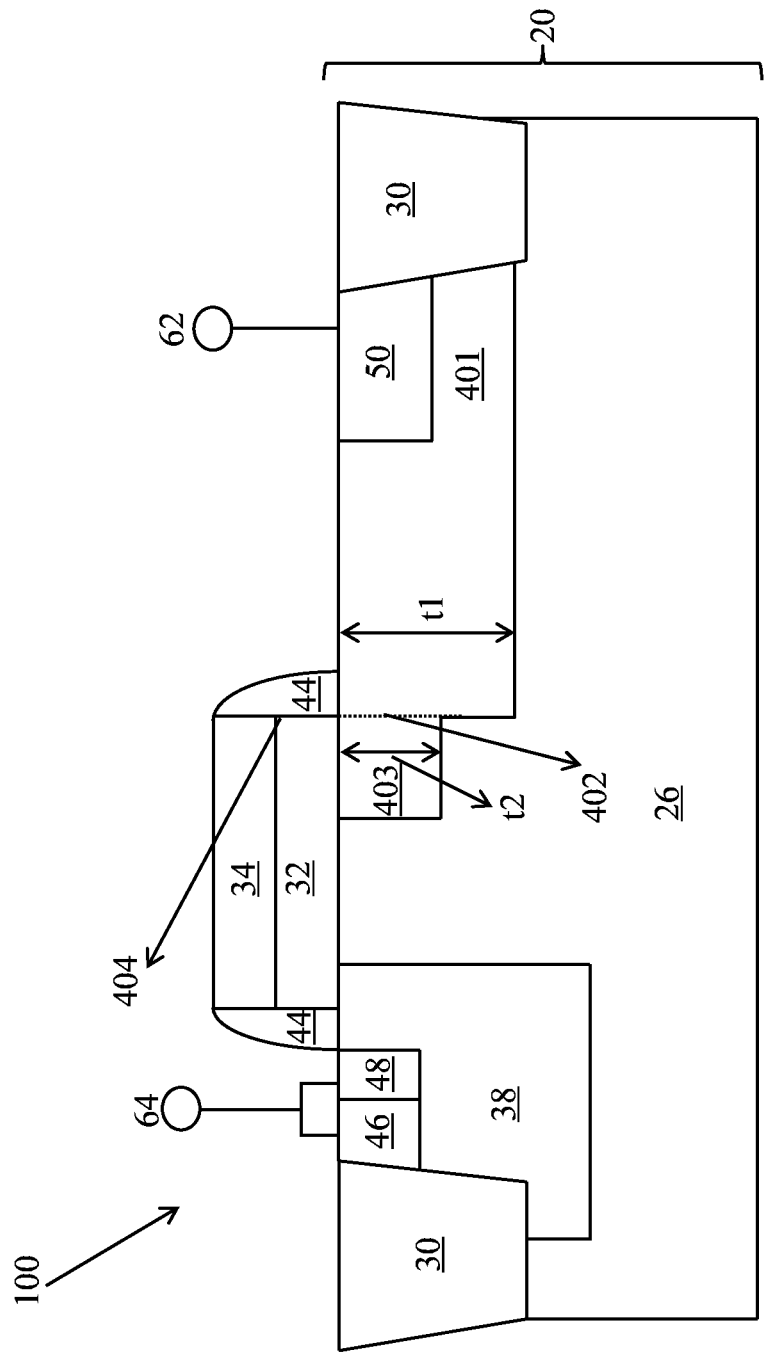

FIGS. 1(a)-1(b) illustrate in cross sectional views a power MOSFET 100 in accordance with some embodiments. Semiconductor manufacturing processes that may be used to form the power MOSFET 100 include photolithography, wet and dry etching, plasma etching, ashing, chemical vapor deposition, plasma vapor deposition, plasma enhanced chemical vapor deposition, electroless plating and electroplating, silicidation, oxide deposition including thermal oxidation, tetra-ethoxysilane (TEOS), spun on glass and other oxide and nitride depositions, planarization processes such as chemical mechanical planarization (CMP), forming isolation regions using trenches or local oxidation of silicon (LOCOS) and the like.

In FIGS. 1(a)-1(b), a portion of a semiconductor substrate 20 is shown. The semiconductor substrate 20 may be a p type doped substrate, or an n type doped substrate, which means that the semiconductor substrate 20 may be doped with either n type or p type impurities. The semiconductor substrate 20 may be formed from silicon, gallium arsenide, silicon germanium, silicon carbon, or other known semiconductor materials used in semiconductor device processing. Although in the illustrated examples presented herein for explanation a semiconductor substrate is used, in other alternative embodiments epitaxially grown semiconductor materials may be used, or, silicon on insulator (SOI) layer may be used, as the substrate 20.

As it is known, dopant impurities can be implanted into a semiconductor material to form a p type or an n type material. A p type material may be further classified as p++, p+, p, p−, p−−, type materials, depending on the concentration of the dopant. If a material is stated to be a p type material, it is doped with p type impurities and it may be any of the p+, p+, p, p−, p−−, type materials. Similarly, an n type material may be further classified as n++, n+, n, n−, n−− type materials. If a material is stated to be an n type material, it is doped with n type impurities and it may be any of the n++, n+, n, n−, n−− type materials. Dopant atoms for p type materials include boron, for example. In n type materials, dopant atoms include phosphorous, arsenic, and antimony, for example. Doping may be done by ion implantation processes. When coupled with photolithographic processes, doping may be performed in selected areas by implanting atoms into exposed regions while other areas are masked. Also, thermal drive or anneal cycles may be used to use thermal diffusion to expand or extend a previously doped region. As alternatives, some epitaxial deposition of semiconductor materials allow for in-situ doping during the epitaxial processes. Implantation can be done through certain materials, such as thin oxide layers, as is known.

The doping concentration amounts for the well region and the diffusions described may vary with the process used and the particular design. Doping concentrations at a p type material or an n type material may range from 1E14 atoms/cm$^3$ to 1E22 atoms/cm$^3$, with a p+/n+ material with concentrations being greater than about 1E18/cm$^3$, for example. Some other ranges of concentrations may be used, such as a n−−/p−− material with a doping concentration less than 1E14 atoms/cm$^3$, a n−/p− material with a doping concentration ranging from 1E14 atoms/cm$^3$ to 1E16 atoms/cm$^3$, a n/p material with a doping concentration ranging from 1E16 atoms/cm$^3$ to 1E18 atoms/cm$^3$, a n+/p+ material with a doping concentration ranging from 1E18 atoms/cm$^3$ to 1E20 atoms/cm$^3$, and a n++/p++ material with a doping concentration ranging larger than 1E20 atoms/cm$^3$. Further alternative ranges of concentrations may be used, such as a n−−/p−− material with a doping concentration range around $10^{15}$~$10^{18}$/cm$^3$, and a n−/p− material with a doping concentration 5~100 times heavier than the concentration of a n−−/p−− material.

As illustrated in FIGS. 1(a)-1(b), a power MOSFET 100 comprises a semiconductor substrate 20. Insulation regions 30 are formed to extend from the top surface of substrate 20 into substrate 20. Insulation regions 30 may be Shallow Trench Isolation (STI) regions, and hence are referred to as STI regions 30 hereinafter, although they may also be other types of insulation regions such as field oxide regions. The field oxide regions may comprise a thermal oxide of silicon, which may be formed through local oxidation of silicon substrate 20.

A first region 26 of a first conductivity type is formed by implanting ions of an impurity of a first conductivity type, such as a p type, into the semiconductor substrate 20 through an insulating film and then thermally diffusing the implanted ions. The first region 26 may have an impurity concentration between about $10^{15}$/cm$^3$ and about $10^{17}$/cm$^3$, although a higher or a lower concentration may be used. There may be an n+ buried layer (NBL) formed beneath the first region 26, which is not shown. The first region extends from a top surface of the substrate 20 into the semiconductor substrate 20.

A gate dielectric 32 may be formed on and in contact with a surface of the first region 26, and a gate electrode 34 is formed on and in contact with the gate dielectric 32. In some embodiments, the gate dielectric 32 may comprise silicon oxide, silicon nitride, a high-k dielectric material, multi-layers thereof, or combinations thereof. The gate electrode 34 may comprise a conductive material such as doped polysilicon, a metal, a metal alloy, or the like. A first spacer 44 may be formed around a first edge 404 of the gate dielectric 32 and the gate electrode 34, and a second spacer 44 may be formed around another edge of the gate dielectric 32 and the gate electrode 34.

A second region 38 of the first conductivity type, such as the p type, is formed within the first region 26, and separated from other devices by the STI 30. The second region 38 is formed at a first side of the gate electrode 34 while a drift region 401 is formed at a second side of the gate electrode 34. In some exemplary embodiments, the second region 38 has a p type impurity concentration higher than the impurity concentration of the first region 26. For example, the p type impurity concentration of the second region 38 may be between about $10^{16}$/cm$^3$ and about $10^{18}$/cm$^3$, although a higher or a lower impurity concentration may be adopted. The implantation may be tilted, so that the second region 38 extends directly underlying the gate electrode 34.

A third region 24 of a second conductivity type, such as an n type, may be formed within the first region 26 and separated from other devices by the STI 30. The third region 24 may be formed, for example, by implanting an n type impurity into the first region 26. In some exemplary embodiments, the third region 24 has an n type impurity concentration between about $10^{16}/cm^3$ and about $10^{18}/cm^3$, although a higher or a lower impurity concentration may be adopted. The third region 24 is optional. The embodiment of a power MOSFET 100 shown in FIG. 1(b) does not have the third region 24.

A first drift region 401 of a second conductivity type, such as an n type, is formed at a second side of the gate electrode 34, next to the third region 24 if the third region 24 exists. The first drift region 401 extends from the top surface of the substrate 20 into the substrate 20. An edge 402 of the first drift region 401 is substantially aligned to an edge 404 of the gate electrode 34. However, in some embodiments, it is possible that the doped first drift region 401 may diffuse outward and may not align to an edge 404 of the gate electrode 34 perfectly. The n type impurity concentration of the first drift region 401 may be between about $10^{15}/cm^3$ and about $10^{17}/cm^3$, although higher or lower impurity concentrations may be adopted. In some exemplary embodiments, a depth t1 of the first drift region 401 may be between about 0.02 μm and about 1 μm.

A second drift region 403 may be formed within the first region 26, beneath the gate electrode 304, and adjacent to the first drift region 401, with a depth less than a depth of the first drift region 401 so that the first drift region 401 and the second drift region 403 together form a stepwise shape. The second drift region 403 may have a similar impurity concentration of the second conductivity type as the impurity concentration of the first drift region 401. However, in some other embodiment, the second drift region 403 may have a different impurity concentration of the second conductivity type from the impurity concentration of the first drift region 401. In some embodiment, a sum of a depth t2 of the second drift region 403, a depth of the gate dielectric 32, and a depth of the gate electrode 34 is of substantially a same value as a depth t1 of the first drift region 401. The first drift region 401 and the second drift region 403 may be formed at the same time. However, in some other embodiment, the sum of the depth of the second drift region 403, the depth of the gate dielectric 32, and the depth of the gate electrode 34 may have a different value as the depth of the first drift region 401, and the first drift region 401 and the second drift region 403 may be formed at a different time. Alternatively, the first drift region 401 and the second drift region 401 may be viewed as a stepped drift region, which is of a second conductivity type, such as an n type, and of a third impurity concentration. The stepped drift region is formed within the first region. The stepped drift region comprises a first part which is the first drift region 401, and a second part which is the second drift region 403.

A source region 48 of the second conductivity type may be formed within the second region 38. A drain region 50 of the second conductivity type may be formed within the first drift region 401. The source region 48 may have a source contact 64. The drain region 50 may have a drain contact 62. Both the source region 48 and the drain region 50 are formed by implanting ions of an impurity of a second conductivity type, such as an n type, into the first drift region 401 and the second region 38, respectively. The source region 48 and the drain region 50 may be formed by implanting an n type dopant such as phosphorous to a concentration between about $1\times10^{19}/cm^3$ and about $2\times10^{21}/cm^3$, for example. Alternatively, other n type dopants such as arsenic, antimony, or combinations thereof, may also be used. In addition, as shown in FIG. 1(b), an option pickup region 46 of the first conductivity type is also formed in the second region 38. The pickup region 46 may be formed by implanting a p type dopant such as boron, indium, or the like to a concentration between about $1\times10^{19}/cm^3$ and about $2\times10^{21}/cm^3$, for example.

As illustrated in FIG. 1(a), a dielectric layer 56 and a field plate 58 may be formed on the surface of the substrate 20, covering a part of the first drift region 401, and a part of the gate electrode 34. The dielectric layer 56 and the field plate 58 are optional and they are not illustrated in FIG. 1(b). The dielectric layer 56 may include silicon oxide, silicon nitride, silicon oxynitride, a high-k dielectric material, combinations thereof, or multi-layers thereof. The dielectric layer 56 may have a thickness between about 100 Å and about 2,500 Å, although different thicknesses may be used. The thickness of the dielectric layer 56 may be selected based on the desirable breakdown voltage of the respective power MOSFET 100. A higher breakdown voltage requires a greater thickness, and a lower breakdown voltage requires a smaller thickness. The dielectric layer 56 may be a substantially conformal layer, wherein the thickness of the horizontal portion of the dielectric layer 56 on the first drift region 401 is substantially equal to the thickness of the vertical portion of the dielectric layer 56 on the sidewall of the gate spacer 44 and the thickness of the dielectric layer 56 on the gate electrode 34. Furthermore, the dielectric layer 56 may include a first portion over and aligned to gate electrode 34, and a second portion over and aligned to first drift region 401. The top surface of the first portion may be higher than the top surface of the second portion of dielectric layer 56. The bottom surface of the first portion of dielectric layer 56 may be in physical contact with the top surface of gate electrode 34. The bottom surface of the second portion of dielectric layer 56 may be in physical contact with the top surface of the first drift region 401.

The field plate 58 may comprise a conductive material such as polysilicon, a metal, a metal silicide, or the like. The field plate 58 includes a first portion over and aligned to a portion of first drift region 401, and a second portion over and aligned to a part of gate electrode 34, wherein the top surface of the first portion may be higher than the top surface of the second portion. A contact plug 66 may be formed to access the field plate 48.

The power MOSFET 100 illustrated in FIGS. 1(a)-1(b) is an n-type power MOSFET. In accordance with alternative embodiments, a p-type power MOSFET may be formed. The p-type power MOSFET may have a structure similar to the structure shown in FIGS. 1(a)-1(b), except that the conductivity types of regions 26, 24, 38, 401, 403, 48, and 50, and the like, are inverted from the conductivity types of the like components represented using the like reference numerals.

FIGS. 2(a)-2(i) illustrate in cross-sectional views a process of making a power MOSFET, in accordance with some embodiments. The resulting power MOSFET may be the power MOSFET shown in FIG. 1(a). Alternatively methods may be used to make the power MOSFET shown in FIG. 1(a) or alternative embodiments of the power MOSFET.

Figure 2A:
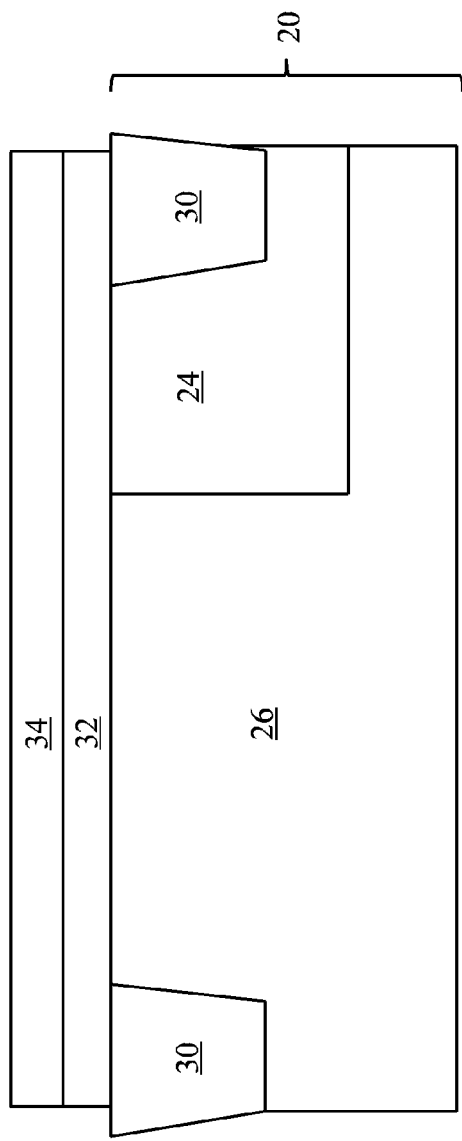
FIGS. 2(a)-2(i) illustrate in cross-sectional views a process of making a power MOSFET, in accordance with some embodiments.

As illustrated in FIG. 2(a), a substrate 20 is provided. An optional n+Buried Layer (NBL) may be formed in a portion of the substrate 20, which is not shown. A plurality of insulation regions 30, which may be shallow trench isolation (STI) regions, are formed to extend from the top surface of substrate 20 into substrate 20. A first region 26 is formed extending from a top surface of the substrate 20 into the substrate 20, wherein the first region 26 is of a first conductivity type, such as a p type, with a first impurity concentration. The first region 26 is surrounded by the plurality of STI regions 30. A third region 24 of a second conductivity type, such as an n type, with a fourth impurity concentration, may be formed within the first region 26 and separated from other devices by the STI 30. The third region 24 may be formed, for example, by implanting an n type impurity into the first region 26. The third region 24 is an optional region. Furthermore, a gate dielectric material 32, which may be a silicon oxide, silicon nitride, a high-k dielectric material, is deposited to cover and in contact with the surface of the substrate 20. A gate electrode material 34, which may be a doped polysilicon, a metal, a metal alloy, or the like, is deposited over and in contact with the gate dielectric material 32.

Figure 2B:
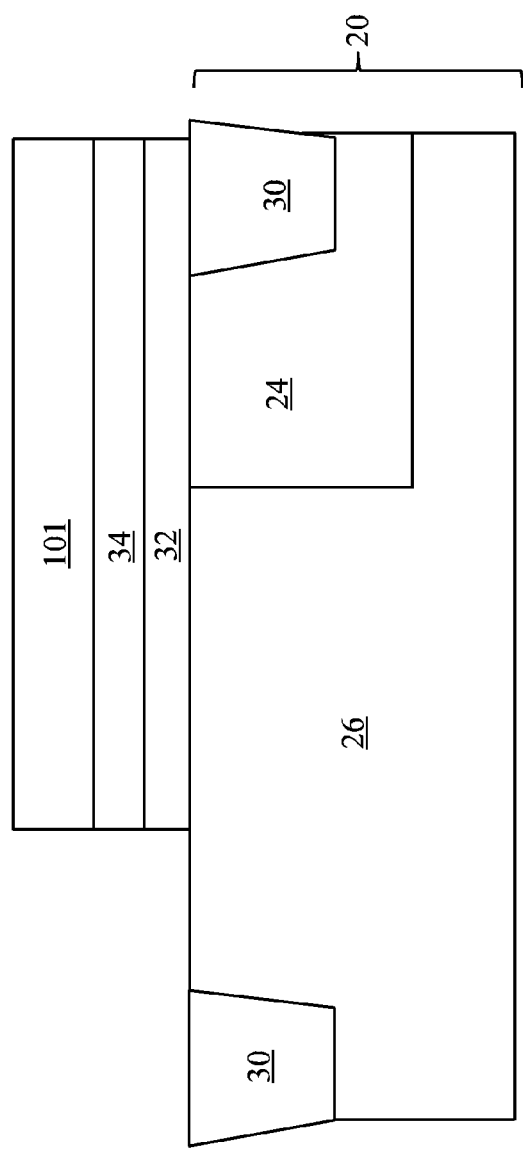

As illustrated in FIG. 2(b), the gate dielectric material 32 and the gate electrode material 34 are patterned using a photoresist material 101 to cover a part of the gate dielectric material 32 and the gate electrode material 34. The portion of the gate dielectric material 32 and gate electrode material 34 uncovered by photoresist material 101 may be etched away, so that a first portion of the first region 26 is exposed for further processing.

Figure 2C:
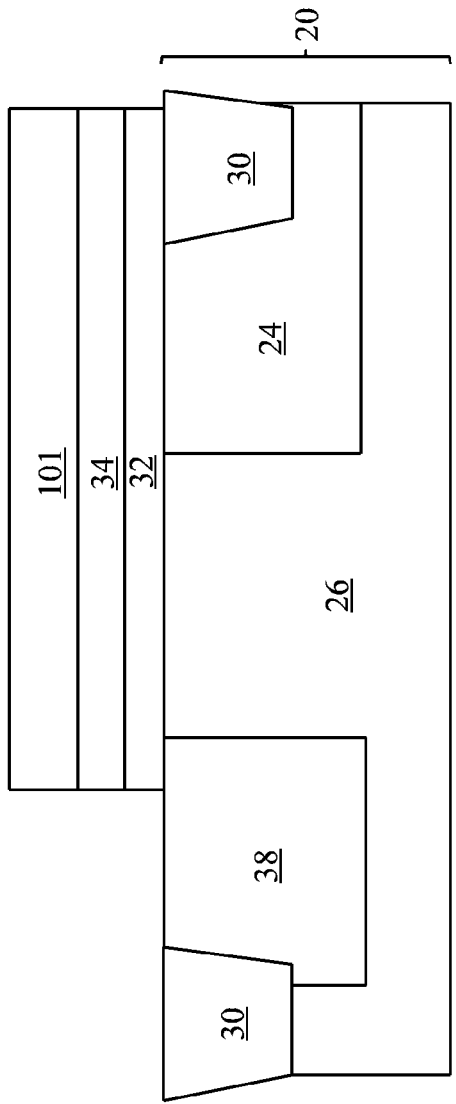

As illustrated in FIG. 2(c), an implantation is then performed to dope the exposed first portion of the first region 26, so that a second region 38 is formed within the first portion of the first region 26, next to the STI region 30. In some exemplary embodiments, the second region 38 has a p type impurity concentration higher than the impurity concentration of first region 26. The implantation may be tilted, so that the second region 38 extends directly underlying gate electrode 34. The second region 38 may be formed by other methods as well.

Figure 2D:
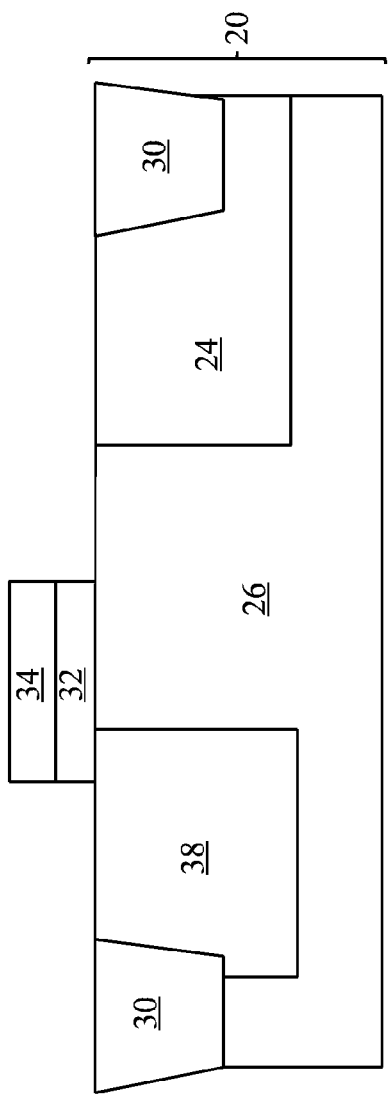

As illustrated in FIG. 2(d), after the formation of the second region 38, a second patterning is performed using a photoresist material placed on the gate dielectric material 32 and the gate electrode material 34. The portion of the gate dielectric material 32 and the gate electrode material 34 uncovered by photoresist materials may be etched away to form a resulting gate dielectric 32 and gate electrode 34. Photoresist material may then be removed, and leaving a structure shown in FIG. 2(d), where the gate dielectric 32 and the gate electrode 34 may be formed over the surface of the first region 26, exposing a second portion of the first region 26.

Figure 2E:
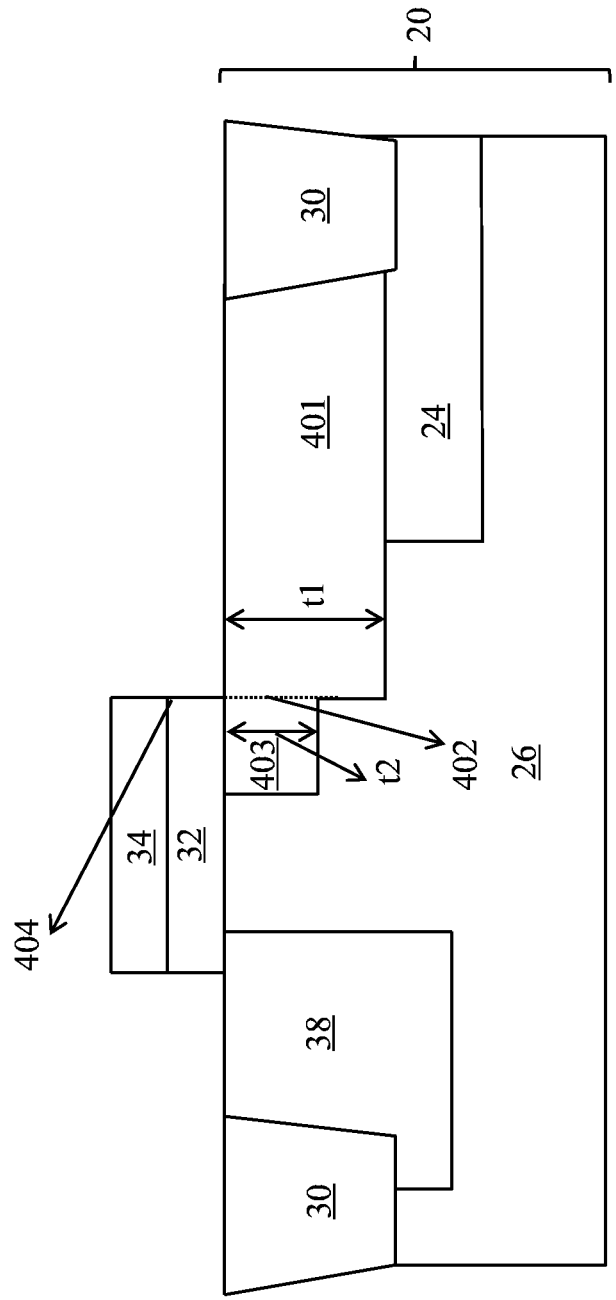

As illustrated in FIG. 2(e), an implantation is performed to form drift regions 401 and 403 of the second conductivity type, which may be an n type, with a third impurity concentration. To form the drift regions 401 and 403, photoresist material (not shown) may be formed to cover the second region 38 and other regions that are not to be implanted. After the formation of drift regions 401 and 403, photoresist material is removed. The first drift region 401 extends from the top surface of substrate 20 into substrate 20. In some exemplary embodiments, a depth t1 of the first drift region 401 is between about 0.02 µm and about 1 µm. The implantation of the first drift region 401 may be performed using the gate electrode 34 as an implantation mask. The second drift region 403 is formed within the first region 26, beneath the gate electrode 34, and adjacent to the first drift region 401. The implantation and formation of the first drift region 401 and the second drift region 403 may be done at the same time. A sum of a depth t2 of the second drift region 403, a depth of the gate dielectric, and a depth of the gate electrode is of substantially a same value as a depth t1 of the first drift region 401. Alternatively, the first drift region 401 and the second drift region 403 may be formed at a different time.

Figure 2F:
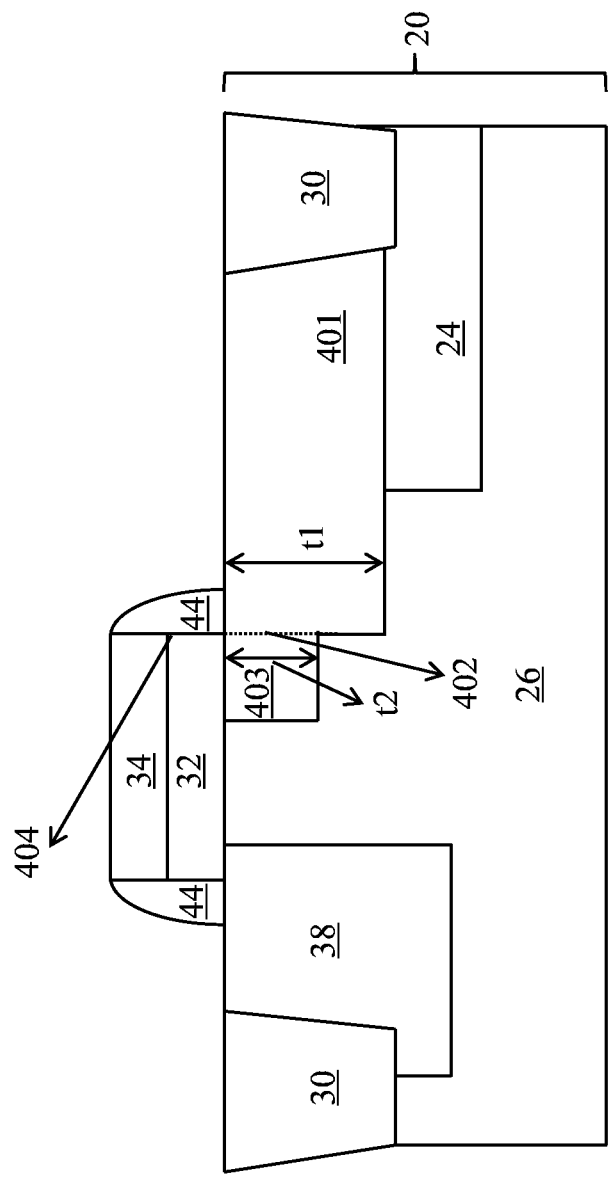

As illustrated in FIG. 2(f), a first spacer 44 is formed around a first edge 404 of the gate dielectric 32 and the gate electrode 34, and a second spacer 44 is formed around a second edge of the gate dielectric 32 and the gate electrode 34. The first spacer 44 may be over the first drift region 401. The second spacer may be over the second region 38.

Figure 2G:
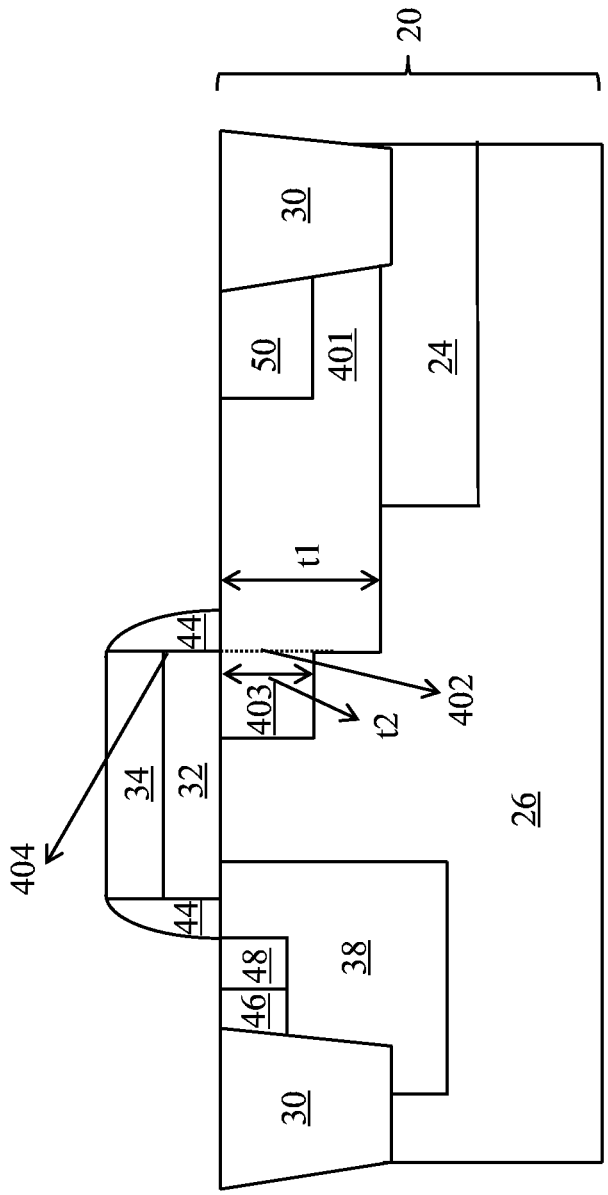

As illustrated in FIG. 2(g), a source region 48 is formed within the second region 38. The source region 48 is of the second conductivity type. A drain region 50 of the second conductivity type is formed within the first drift region 401. A pickup region 46 of the first conductivity type may be formed within the second region 38 and next to the source region 48. The source region 48 and the drain region 50 may be formed by implanting an n type dopant such as phosphorous to a concentration between about $1\times10^{19}/cm^3$ and about $2\times10^{21}/cm^3$, for example. The pickup region 46 may be formed by implanting a p type dopant such as boron, indium, or the like to a concentration between about $1\times10^{19}/cm^3$ and about $2\times10^{21}/cm^3$, for example.

Figure 2H:
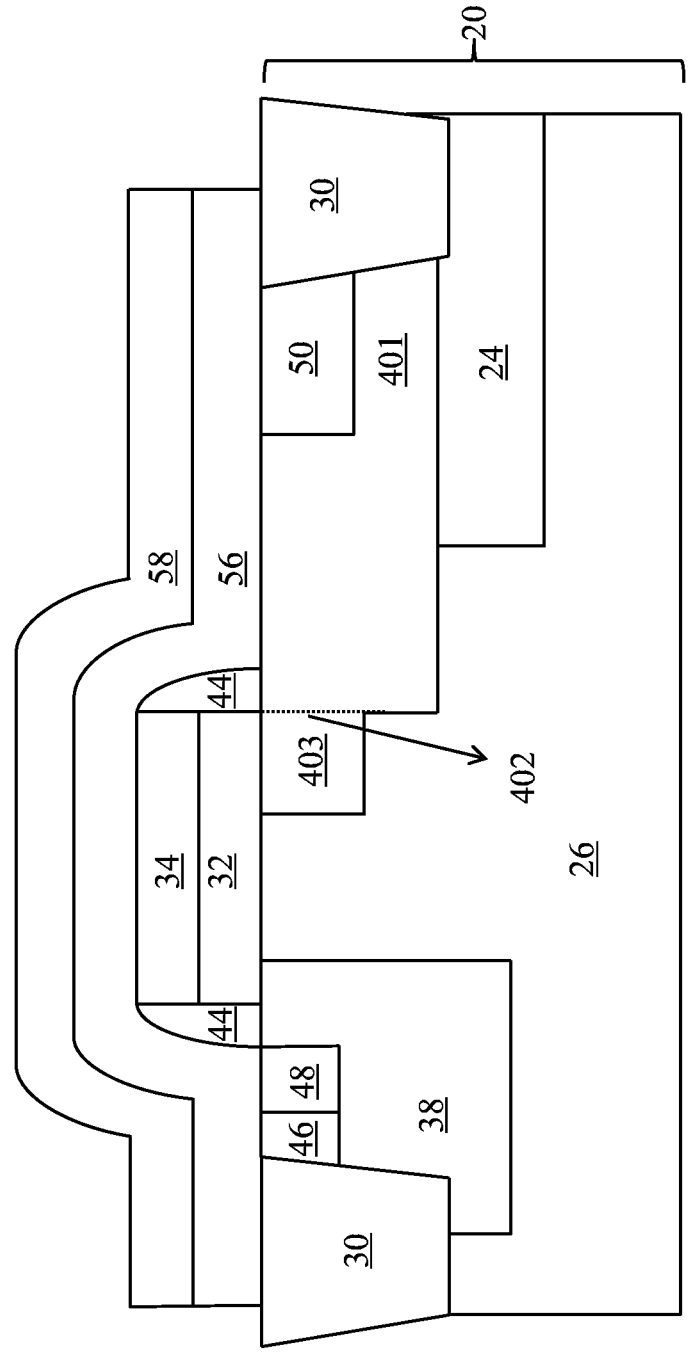

As illustrated in FIG. 2(h), a dielectric layer 56 and a field plate 58 may be formed covering the surface of the second region 38, the first drift region 401, the source region 48, the drain region 50, the gate electrode 34, and the gate spacers 44. The dielectric layer 56 may include silicon oxide, silicon nitride, silicon oxynitride, a high-k dielectric material, combinations thereof, or multi-layers thereof. The field plate 58 comprises a conductive material such as polysilicon, a metal, a metal silicide, or the like. The dielectric layer 56 and a field plate 58 are optional and may not exist in some other embodiments.

Figure 2I:
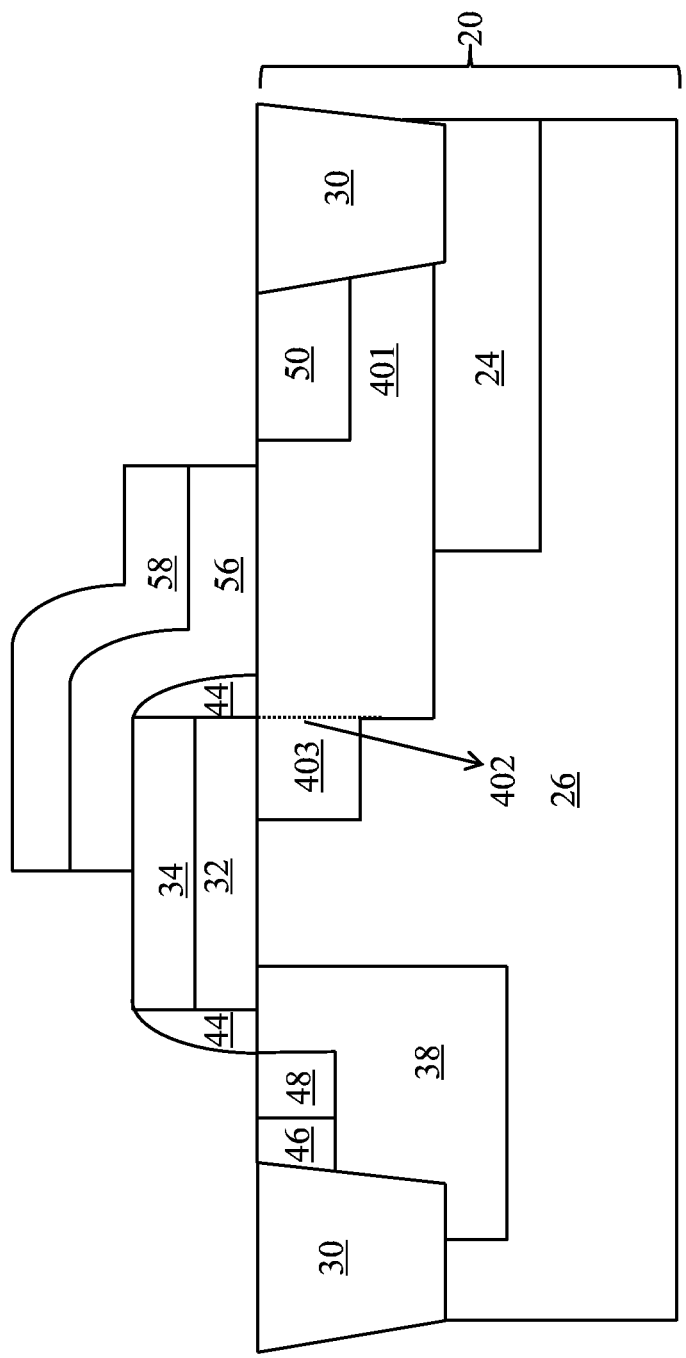

As illustrated in FIG. 2(i), a portion of the dielectric layer 56 and the field plate 58 may be etched away, leaving a structure covering a part of the first drift region 401, and a part of the gate electrode 34. The resulting dielectric layer 56 comprises a first portion over and in contact with a top surface of the first drift region 401 and a second portion over and in contact with a top surface of the gate electrode 34. Similarly, the field plate 58 over the dielectric layer 56 also comprises a first portion over the first portion of the dielectric layer 56, and a second portion over and in contact with a top surface of the second portion of the dielectric layer 56.

The process shown in FIGS. 2(a)-2(i) is merely illustrative and is not limiting. There may be other variations of the process steps, and the process steps may be performed in different sequences. Other process steps may follow after the process shown in FIGS. 2(a)-2(i). For example, a contact plug may be formed to access the field plate 48. The source region 48 may have a source contact. The drain region 50 may have a drain contact.

In accordance with embodiments, a power MOSFET may be formed. The power MOSFET may comprise a substrate. A first region may extend from a top surface of the substrate into the substrate, wherein the first region is of a first conductivity type with a first impurity concentration. A gate dielectric may be formed over and in contact with the first region. A gate electrode may be formed over and in contact with the gate dielectric. A second region of the first conductivity type may be formed within the first region at a first side of the gate electrode, wherein the second region has a second impurity concentration. A first drift region may be formed within the first region at a second side of the gate electrode, wherein the first drift region is of a second conductivity type opposite to the first conductivity type, the first drift region has a third impurity concentration. A second drift region may be formed within the first region and beneath the gate electrode, wherein the second drift region is of the second conductivity type and of the third impurity concentration, the second drift region is adjacent to the first drift region, with a depth less than a depth of the first drift region so that the first drift region and the second drift region together form a stepwise shape. Furthermore, a source region of the second conductivity type may be formed within the second region, and a drain region of the second conductivity type may be formed within the first drift region.

In accordance with embodiments, a power MOSFET may be formed. The power MOSFET may comprise a substrate. The power MOSFET may comprise a first region extending from a top surface of the substrate into the substrate, wherein the first region is of a first conductivity type with a first impurity concentration. The power MOSFET may comprise a gate dielectric over and in contact with the first region, and a gate electrode over and in contact with the gate dielectric. The power MOSFET may comprise a second region within the first region at a first side of the gate electrode, wherein the second region is of the first conductivity type, and has a second impurity concentration. The power MOSFET may comprise a third region within the first region at a second side of the gate electrode, wherein the third region is of a second conductivity type opposite to the first conductivity type, and has a third impurity concentration. The power MOSFET may comprise a first drift region within the first region and above the third region, wherein the first drift region is of the second conductivity type, the first drift region has a fourth impurity concentration. The power MOSFET may comprise a second drift region of the second conductivity type and of the third impurity concentration, wherein the second drift region is beneath the gate electrode and adjacent to the first drift region, a sum of a depth of the second drift region, a depth of the gate dielectric, and a depth of the gate electrode is of substantially a same value as a depth of the first drift region. The power MOSFET may further comprise a source region of the second conductivity type within the second region, and a drain region of the second conductivity type within the first drift region.

In accordance with embodiments, a method for making a power MOSFET is presented. The method may comprise providing a substrate with a plurality of insulation regions surrounding a first region, wherein the first region extends from a top surface of the substrate into the substrate, the first region is of a first conductivity type with a first impurity concentration. The method may comprise depositing a gate dielectric material over and in contact with the first region, and depositing a gate electrode material over and in contact with the gate dielectric material. The method may comprise removing a first part of the gate dielectric material and a first part of the gate electrode material to expose a first portion of the first region. The method may comprise forming a second region within the first portion of the first region, wherein the second region is of the first conductivity type and has a second impurity concentration. The method may comprise forming a gate dielectric and a gate electrode over the first region by removing a second part of the gate dielectric material and a second part of the gate electrode material to expose a second portion of the first region. The method may comprise forming a first drift region within the second portion of the first region, wherein the first drift region is of a second conductivity type opposite to the first conductivity type, the first drift region has a third impurity concentration. The method may comprise forming a second drift region within the first region, wherein the second drift region is beneath the gate electrode and adjacent to the first drift region, the second drift region is of the second conductivity type and of the third impurity concentration. Furthermore, the method may comprise forming a source region of the second conductivity type within the second region, and forming a drain region of the second conductivity type within the first drift region.

A power MOSFET may comprise a first drift region formed at a side of a gate electrode, and a second drift region beneath the gate electrode, adjacent to the first drift region. The first drift region and the second drift region may be formed at the same time, using the gate electrode as a part of the implanting mask. The depth of the second drift region may be shallower than a depth of the first drift region. The two drift regions of the power MOSFET can reduce the high on-resistance $R_{dson}$, reduce device capacitance, and further improve HCI capability, while the first drift region alone can suffer stronger hot-carrier reliability problem because of shallower current flow near silicon surface.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a substrate;
   a well of a first impurity type in the substrate;
   a gate structure over the well;
   a region of a first conductivity type, formed at a first side of the gate structure;
   a drift region of a second conductivity type opposite to the first conductivity type, formed at a second side of the gate structure and including a first part extending from a top surface of the substrate to a first depth into the well, a second part underlying the gate structure and extending a second depth less than the first depth from the top surface of the substrate into the well;
   a source region of the second conductivity type within the region; and
   a drain region of the second conductivity type within the first part of the drift region, extending a third depth less than the first depth from the top surface of the substrate into the well.

2. The device of claim 1, wherein the gate structure includes a gate dielectric on the top surface of the substrate and a gate electrode on the gate dielectric.

3. The device of claim 2, wherein the first part of the drift region and the second part of the drift region form an interface, the interface being substantially aligned with an edge of the gate electrode.

4. The device of claim 2, wherein a sum of the second depth of the second part of the drift region, a depth of the gate dielectric, and a depth of the gate electrode is of substantially a same value as the first depth of the first part of the drift region.

5. The device of claim 1, wherein the well and the region are p-type and the drift region is n-type.

6. The device of claim 1, further comprising:
   a dielectric layer comprising:
      a first portion overlying and in contact with the drift region; and
      a second portion overlying and in contact with the gate structure; and a conductive field plate over and in contact with the dielectric layer and substantially co-terminus with the dielectric layer.

7. The device of claim 6, wherein the conductive field plate comprises a first portion over and in contact with the first portion of the dielectric layer, and a second portion over and in contact with the second portion of the dielectric layer.

8. The device of claim 1, wherein the region extends under the gate structure.

9. A device comprising:
a substrate;
a first region extending into the substrate, wherein the first region is of a first conductivity type with a first impurity concentration;
a gate dielectric over the first region;
a gate electrode over the gate dielectric;
a second region within the first region at a first side of the gate electrode, wherein the second region is of the first conductivity type, and has a second impurity concentration;
a third region within the first region at a second side of the gate electrode, wherein the third region is of a second conductivity type opposite to the first conductivity type, and has a third impurity concentration;
a drift region within the first region, wherein the drift region is of the second conductivity type, and has a fourth impurity concentration, and wherein the drift region comprises:
a first part formed above the third region; and
a second part beneath the gate electrode, adjacent to the first part, with a depth less than a depth of the first part;
a source region of the second conductivity type within the second region; and
a drain region of the second conductivity type within the first part of the drift region.

10. The device of claim 9, wherein a difference between the depth of the first part and the depth of the second part is substantially equivalent to a combined thickness of the gate dielectric and the gate electrode.

11. The device of claim 9, wherein the first part and the second part of the drift region form an interface that is substantially aligned with an edge of the gate electrode.

12. The device of claim 9, wherein a sum of the depth of the second part of the drift region, a depth of the gate dielectric, and a depth of the gate electrode is of substantially a same value as the depth of the first part of the drift region.

13. The device of claim 9, further comprising:
a dielectric layer comprising a first portion over and in contact with the first part of the drift region and a second portion over and in contact with the gate electrode; and
a conductive field plate over and in contact with the dielectric layer, wherein the conductive field plate comprises a first portion over and in contact with the first portion of the dielectric layer, and a second portion over and in contact with the second portion of the dielectric layer.

14. The device of claim 9, wherein the second region extends under the gate electrode.

15. A semiconductor device comprising:
a semiconductor substrate;
a first region extending from a top surface of the semiconductor substrate into the semiconductor substrate, wherein the first region comprises impurities of a first type;
a gate dielectric over the first region;
a gate electrode over the gate dielectric;
a first drift region within the first region, wherein the first drift region comprises impurities of a second type opposite the first type, and wherein the first drift region extends from the top surface of the semiconductor substrate to a first depth within the semiconductor substrate; and
a second drift region within the first region and adjacent the first drift region, wherein the second drift region comprises impurities of the second type, wherein the second drift region extends under the gate dielectric from the top surface of the semiconductor substrate to a second depth within the semiconductor substrate, and wherein the first depth is substantially equal to a combination of the second depth, a thickness of the gate dielectric, and a thickness of the gate electrode.

16. The semiconductor device of claim 15, wherein a sidewall of the first drift region and a sidewall of the gate dielectric are substantially aligned.

17. The semiconductor device of claim 15, further comprising:
a first source/drain region within the first drift region;
a second region within the first region and comprising impurities of the first type, wherein the second region is disposed on an opposing side of the gate dielectric as the first drift region; and
a second source/drain region in the second region.

18. The semiconductor device of claim 17, wherein the second region comprises a higher concentration of the impurities of the first type than the first region.

19. The semiconductor device of claim 15 further comprising:
a dielectric layer over the gate electrode and the first drift region; and
a field plate over the dielectric layer and the first drift region.

20. The semiconductor device of claim 15 further comprising a third region within the first region and under the first drift region, wherein the third region comprises impurities of the second type.

* * * * *